United States Patent [19]

Kokubo et al.

[11] Patent Number: 4,797,895
[45] Date of Patent: Jan. 10, 1989

[54] SEMICONDUCTOR LASER APPARATUS

[75] Inventors: Yoshihiro Kokubo; Wataru Susaki, both of Itami, Japan

[73] Assignee: Mitsubishi Denki Kabushiki Kaisha, Tokyo, Japan

[21] Appl. No.: 881,260

[22] Filed: Jul. 2, 1986

[30] Foreign Application Priority Data

Jul. 2, 1985 [JP] Japan .................................. 60-147446

[51] Int. Cl.⁴ .............................................. H01S 3/19
[52] U.S. Cl. ........................................ 372/43; 372/49;
357/19; 346/160; 250/205
[58] Field of Search ............... 372/43, 49, 50; 357/19;
346/160; 250/205

[56] References Cited

U.S. PATENT DOCUMENTS

Re. 25,632 8/1964 Boyle et al. ........................... 372/49

4,375,067 2/1983 Kitamura ............................. 372/43

*Primary Examiner*—William L. Sikes
*Assistant Examiner*—Georgia Y. Epps
*Attorney, Agent, or Firm*—Lowe, Price, LeBlanc, Becker & Shur

[57] ABSTRACT

A semiconductor laser apparatus in accordance with the present invention comprise: a semiconductor laser chip including a resonator with a couple of opposite end faces of which one is provided with an antireflective coating and the other with a highly reflective coating; a stem having a main surface to which the chip is attached with the end faces being vertical to the main surface; and a photoelectric conversion device, a major surface of which absorbs a part of a laser beam emitted from said one end face thereby to monitor intensity of the beam and reflects the remaining part of the beam for practical use.

12 Claims, 1 Drawing Sheet

SEMICONDUCTOR LASER APPARATUS

BACKGROUND OF THE INVENTION

1. Field of the Invention

This invention relates to a semiconductor laser apparatus and more particularly to improvement of the optical system in the laser apparatus.

2. Description of the Prior Art

Referring to FIG. 1, there is shown a sectional view of a prior art laser apparatus. A semiconductor laser chip 1 is attached to a side wall of a block 8 which is fixed on the top surface 5a of a stem 5. The stem 5 is provided with an electrode 3 which is connected to the laser chip 1 through a bonding wire 6a. Both end faces 1a, 1b of a resonator in the laser chip 1 are substantially parallel to the top surface 5a of the stem 5. The upper end face 1a in the laser chip 1 is provided with an antireflective coating, while the lower end face 1b is provided with a reflective coating. A strong laser beam 9a is emitted upward from the upper end face 1a and another weak laser beam 9b is emitted downward from the lower end face 1b. Various characteristics of the semiconductor laser can be controlled by controlling the reflectance of each of the end faces 1a, 1b of the resonator. Also fixed on the surface 5a of the stem 5 is a mount to which a photodiode 2 is attached. The stem 5 is provided with another electrode 4 which is connected to the photodiode 2 through another bonding wire 6b. A major surface 2a of the photodiode 2 is to receive the weak laser beam 9b. and makes a certain angle with the top surface 5a of the stem 5.

In operation, the strong laser beam 9a emitted from the upper end face 1a in the chip 1 is offered for practical use, while the other weak laser beam 9b emitted from the lower end face 1b is directed to the photodiode 2. The intensity of the strong beam 9a can be estimated by monitoring the intensity of the weak beam 9b with the photodiode 2, because the intensity of the strong beam 9a is proportional to that of the weak beam 9b.

Since the prior art laser apparatus is structured as described above, there exists a problem that when the reflectance of the reflective coating on the lower end face 1b is increased in order to change the laser characteristics, the weak laser beam 9b is further weakened and thus enough photoelectric conversion output can not be obtained from the photodiode 2. Further, since the laser chip 1 is set vertical to the top surface 5a of the stem 5, there exist another problem that assembling of the laser apparatus is rather complicated.

SUMMARY OF THE INVENTION

It is an object of this invention to provide a semiconductor laser apparatus, the optical system of which is improved.

It is another object of this invention to provide a semiconductor laser apparatus which can be more easily assembled.

It is a further object of this invention to provide a semiconductor laser apparatus in which one of the opposite end faces of the resonator is provided with a more reflective coating.

A semiconductor laser apparatus in accordance with the present invention comprises: a semiconductor laser chip including a resonator with a couple of opposite end faces of which one is provided with an antireflective coating and the other with a highly reflective coating; a stem having a main surface to which the chip is attached with the end faces being vertical, i.e., perpendicular to the main (horizontal) surface; and a photoelectric conversion device, a major surface of which absorbs a part of a laser beam emitted from said one end face thereby to monitor intensity of the beam and reflects the remaining part of the beam for practical use.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
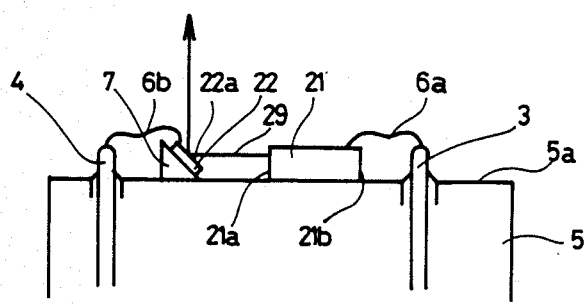
FIG. 2 is a schematic sectional view of a semiconductor laser apparatus according to an embodiment of the present invention.

Referring to FIG. 2, there is shown a schematic sectional view of a semiconductor laser apparatus in accordance with the present invention. A semiconductor laser chip 21 is attached to a main surface 5a of a stem 5. The stem 5 is provided with an electrode 3 which is connected to the laser chip 21 through a bonding wire 6a. A couple of opposite end faces 21a, 21b of a resonator in the laser chip 21 are substantially vertical to the main surface 5a of the stem 5. One 21a of the end faces is provided with an antireflective coating, while the other 21b is provided with a reflective coating having a high reflectance. Materials such as Al, $Al_2O_3$, $SiO_2$, $Si_3N_4$, Au, etc. may be used for the reflective coating. The laser chip emits only one laser beam 29 from the end face 21a with the antireflective coating. Various characteristics of the laser chip 21 can be changed by changing the reflectance of each of the end faces 21a, 21b.

Also disposed on the surface 5a of the stem 5 is a mount 7 to which a photodiode 22 is attached as a photoelectric conversion device. As seen from FIG. 2, the photodiode 22, mounted on mount 7, is located on a longitudinal extension of the laser chip 21. The stem 5 is provided with another electrode 4 which is connected to the photodiode 22 through another bonding wire 6b. A major surface 22a of the photodiode 22 makes a certain angle with the top surface 5a of the stem 5 and is provided with a reflective coating. The reflectance at the major surface 22a of the photodiode 22 can be changed by changing the reflectance of the coating. Materials such as Al, $Al_2O_3$, $SiO_2$, $Si_3N_4$, Au, etc. may be used for this coating.

In operation, the laser beam 29 is emitted from the one end face 21a of the laser chip 21 and directed to the surface 22a of the photodiode 22. Then, a large part of the laser beam 29 is reflected at the surface 22a and led out for practical use from a package (not shown) of the laser apparatus. In the meantime, the remaining part of the laser beam 29 is absorbed by the photodiode 22 to monitor the intensity of the beam 29. The level of the monitoring current from the diode 22 can be adjusted by changing the reflectance of the coating on the surface 22a.

Since the strong laser beam 29 emitted from the one end face 21a with the antireflective coating is directed to the photodiode 22, this embodiment of the present invention disolves the problem that the monitoring of the intensity of the laser beam 9a in the conventional laser apparatus becomes impossible due to insufficiency of the monitoring current from the photodiode 2 when the lower end face 1b in the laser chip 1 is provided with a more highly reflective coating.

Figure 1:
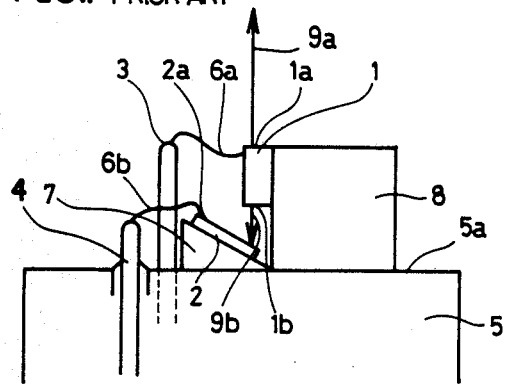
FIG. 1 is a schematic sectional view of a semiconductor laser apparatus according to the prior art.

In the above embodiment shown in FIG. 2, the laser chip 21 is attached directly to the main surface 5a of the stem 5 without such a block 8 as shown in FIG. 1. Further, since the end faces 21a and 21b in the laser chip are set vertical to the main surface 5a of the stem 5, the wire bonding process becomes easier. Accordingly, the laser apparatus of this invention can be more easily assembled, and also the package of the apparatus can be made smaller because the laser chip 21 is set lower.

Although the photodiode 22 in the above described embodiment has the flat surface 22a, a photodiode having a concave surface may be used instead.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus comprising:
    a semiconductor laser chip including a resonator having a pair of oppositely disposed end faces, one of said endfaces having an antireflective coating and a second of said endfaces having a highly reflective coating;
    a stem having a main surface onto which said chip is directly mounted with said pair of end faces being perpendicular to said main surface; and
    a photoelectric conversion device, a major surface of which absorbs a part of a laser beam emitted from said one end face, thereby to monitor intensity of said beam, and reflects the remaining part of said beam for practical use.

2. The apparatus in accordance with claim 1, wherein said reflective coating comprises at least one of Al, $Al_2O_3$, $SiO_2$, $Si_3N_4$ and Au.

3. The apparatus in accordance with claim 1, wherein said major surface of said photoelectric conversion device is provided with a coating comprising at last one of Al, $Al_2O_3$, $SiO_2$, $Si_3N_4$ and Au.

4. Tha apparatus in accordance with claim 1, wherein said major surface of said photoelectric conversion device is flat.

5. The apparatus in accordance with claim 1, wherein said major surface of said photoelectric conversion device is concave.

6. A semiconductor laser apparatus as recited in claim 1 wherein said highly reflective coating on said other end face provides a reflectance higher than that of a surface at said one end face of said laser chip.

7. A semiconductor laser apparatus as recited in claim 1 wherein said photoelectric conversion device is positioned to receive the laser beam emitted from said one end face of said laser chip.

8. A semiconductor laser apparatus as recited in claim 7 wherein said photoelectric conversion device is positioned in a longitudinal extension of said laser chip.

9. A semiconductor laser apparatus as recited in claim 8 wherein said photoelectric conversion device is positioned in a path of a main output beam of said laser chip.

10. A semiconductor laser apparatus as recited in claim 8 wherein said photoelectric conversion device includes a reflective coating.

11. A semiconductor laser apparatus as recited in claim 1 wherein said photoelectric conversion device includes a reflective coating.

12. A semiconductor laser apparatus as recited in claim 11 wherein said major surface of said photoelectric conversion device is disposed at an angle to a path of the laser beam emitted from said one end face of said laser chip thereby to reflect said remaining part of said beam away from said laser chip and to a position for performing the practical use.

* * * * *